(12) United States Patent
Hashimoto

(10) Patent No.: US 6,482,673 B2
(45) Date of Patent: *Nov. 19, 2002

(54) SEMICONDUCTOR DEVICE, METHOD OF MAKING THE SAME, CIRCUIT BOARD, FLEXIBLE SUBSTRATE, AND METHOD OF MAKING SUBSTRATE

(75) Inventor: Nobuaki Hashimoto, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 09/091,291
(22) PCT Filed: Sep. 29, 1997
(86) PCT No.: PCT/JP97/03459

§ 371 (c)(1),
(2), (4) Date: Jun. 16, 1998

(87) PCT Pub. No.: WO98/18164

PCT Pub. Date: Apr. 30, 1998

(65) Prior Publication Data

US 2001/0019852 A1 Sep. 6, 2001

(30) Foreign Application Priority Data

Oct. 17, 1996 (JP) .............................. 8-297530

(51) Int. Cl.⁷ .............................................. H01L 21/44
(52) U.S. Cl. ....................................... 438/106; 438/455
(58) Field of Search ................................ 438/106, 108, 438/107, 118, 127, 455, 461, 464

(56) References Cited

U.S. PATENT DOCUMENTS

| | | | |
|---|---|---|---|
| 5,148,265 A | * 9/1992 | Khandros et al. | 357/80 |
| 5,477,611 A | 12/1995 | Sweis et al. | 29/840 |
| 5,489,804 A | * 2/1996 | Pasch | 257/778 |
| 5,663,106 A | * 9/1997 | Karavakis et al. | 29/841 |
| 5,776,796 A | 7/1998 | Distefano et al. | 438/106 |
| 5,834,339 A | * 11/1998 | Distefano et al. | 438/125 |
| 5,909,633 A | * 6/1999 | Haji et al. | 438/612 |
| 5,966,587 A | * 10/1999 | Karavakis et al. | 438/15 |
| 6,043,109 A | * 3/2000 | Yang et al. | 438/113 |
| 6,054,337 A | * 4/2000 | Solberg | 438/107 |

FOREIGN PATENT DOCUMENTS

| | | |
|---|---|---|
| EP | 0 878 839 | 11/1998 |
| JP | A-59-219942 | 12/1984 |
| JP | 61-100940 | 5/1986 |
| JP | A-64-4038 | 1/1989 |
| JP | A-7-226418 | 8/1995 |
| JP | A-8-236584 | 9/1996 |

OTHER PUBLICATIONS

Tumala et al.; Microelectronics Packaging Handbook Part II: Semiconductor Packaging, Chapman and Hall, 1997, pp. 148–154.*
Tumalla, R. R.; Rymaszewski, E.J.;Klopfenstein, A.G.; Microelectronics Packaging Handbook Part II: Semiconductor Packaging, Chapman and Hall, pp. 671–677, Jun. 1997.*

* cited by examiner

Primary Examiner—John F. Niebling
Assistant Examiner—Christopher Lattin
(74) Attorney, Agent, or Firm—Oliff & Berridge, PLC.

(57) ABSTRACT

This is a semiconductor device, a method of the same, a circuit board, and a flexible substrate that are easy to handle, enable quality assurance, and also enable batch connection of a flexible substrate to the electrodes of a semiconductor chip. A gap preservation member 16 is provided on a surface, of a flexible substrate 12, on which connection portions 24 to electrodes 14 of a semiconductor chip 10 are disposed. The semiconductor chip 10 and the flexible substrate 12 are arranged in a state in which the gap preservation member 16 is interposed therebetween. The connection portions 24 provided on the flexible substrate 12 are connected to the electrodes 14 of the semiconductor chip 10, and a molding material is injected to provide a stress absorption layer 26.

30 Claims, 11 Drawing Sheets

SEMICONDUCTOR DEVICE, METHOD OF MAKING THE SAME, CIRCUIT BOARD, FLEXIBLE SUBSTRATE, AND METHOD OF MAKING SUBSTRATE

TECHNICAL FIELD

This invention relates to a semiconductor device, a method of making the same, a circuit board, and a flexible substrate, and, in particular, to a semiconductor device, a method of making the same, a circuit board, and a flexible substrate in which a flexible substrate is disposed above an active surface of a semiconductor chip.

BACKGROUND OF ART

If high-density mounting of semiconductor devices is pursued, bare-chip mounting would be ideal. However, quality assurance and handling are difficult in the bare chip state. To that end, a semiconductor device has been proposed in which a bare chip is packaged to form a package of a size that is close to the size of the bare chip, as disclosed in, for example, International Publication W095/08856.

This semiconductor device is made as described below. A flexible substrate (abbreviated to substrate) is disposed above the active surface of a semiconductor chip. External electrodes for mounting are provided on this flexible substrate. Leads provided on the flexible substrate are then connected to electrodes of the semiconductor chip while being cut, and a resin in gel form is injected between the semiconductor chip and the flexible substrate to complete the semiconductor device.

With this semiconductor device, inspections can be done reliably in the packaged state, it is possible to ensure product quality because the resin between the semiconductor chip and the flexible substrate covers the active surface of the semiconductor chip, and handling is also easy.

However, with this technique, the leads must be cut one by one and bonded one by one (single-point bonding). If an attempt is made to cut and connect all of the leads at the same time, the support of the flexible substrate disappears and therefore the connection positions of the leads and the electrodes are placed at different positions. This means that the technique disclosed in the above Publication cannot be applied to a batch connection method for all of the leads. This is inferior to batch connections (gang bonding) from the mass production viewpoint.

In addition, since the substrate itself is flexible, various problems caused by flection of the substrate cannot be solved. For example, when the resin in gel form is injected between the semiconductor chip and the substrate, there is a strong possibility that the injection will be uneven, because of this flection. In addition, the external electrodes are positioned on the top of the flexible substrate, so that it is not possible to fix the positions thereof absolutely, and difficulties are likely to occur, particularly during the connection to the external substrate.

In addition, a flexible substrate has to be held by a special jig positioned so as to surround the semiconductor chip, and that jig must be prepared anew.

The present invention was devised in order to solve the above described problems and its objective is to prepare a semiconductor device, a method of making the same, a circuit board, and a flexible substrate that are easy to assure the quality and easy to handle, and are extremely reliable during fabrication.

This invention further provides a semiconductor device, a method of making the same, a circuit board, and a flexible substrate that have superlative mass production capabilities and enable the use of existing fabrication devices without modification in the fabrication thereof.

DISCLOSURE OF INVENTION

A method of making a semiconductor device in accordance with this invention comprises:

a step of preparing a flexible substrate that has a region overlapping a semiconductor chip, the flexible substrate having external electrode formation portions where external electrodes are formed, the external electrode formation portions are formed within the overlapped region;

a step of providing a gap preservation member on at least one of a surface having electrodes of the semiconductor chip and a surface of the flexible substrate that is disposed facing the surface having electrodes of the semiconductor chip; and a step of arranging the semiconductor chip and the flexible substrate with surfaces thereof facing one another, in a state in which the gap preservation member is interposed therebetween, and connecting connection portions formed on the flexible substrate to the electrodes of the semiconductor chip.

With this invention, the preparation of the above-described flexible substrate makes it possible to provide a package that is of the same size as the chip. In this state, a surface of a semiconductor chip having electrodes is arranged so as to face a surface of a flexible substrate that is disposed facing that surface of the semiconductor chip having electrodes, in other words, a surface of the flexible substrate on a side on which connection portions to electrodes are positioned. A gap preservation member is provided on at least one of these surfaces. Since the semiconductor chip and the flexible substrate are arranged with the gap preservation member therebetween, a gap can be guaranteed reliably between the two components. This makes it unnecessary to provide a jig for preserving this gap. Since this constant gap is held between the two components from the step of assembling the semiconductor chip and the flexible substrate onward, unexpected electrical short between the two components can be prevented. In addition, the connection portions of the flexible substrate and the electrodes of the semiconductor chip are connected together in a state in which the gap preservation member is interposed therebetween, so that the gap preservation member acts as a support shaft during the connection, enabling reliable connection.

The gap preservation member formed during the step of providing the gap preservation member is preferably provided within a region that excludes a region corresponding to the external electrode formation portion. In other words, the gap preservation member is not provided in a part corresponding to the external electrode formation portion for the formation of external electrodes. This ensures that the external electrodes can move readily because they are not fixed by the gap preservation member, thus facilitating the relief of thermal stresses.

The batch connection of the connection portions and the electrodes during this connection step is also preferable from the viewpoint of mass production. Note that the problem of flection of the flexible substrate is most likely to occur during the batch connection, but since the connection is performed in a state in which the flexible substrate is held by the gap preservation member, this makes it possible to prevent the problem of flection of the flexible substrate.

In addition, the method could further comprise a stop of forming a stress absorption layer between the semiconductor chip and the flexible substrate.

This stress absorption layer absorbs thermal stresses caused by the difference in coefficients of thermal expansion between the semiconductor chip and the flexible substrate, and also thermal stresses caused by the difference in coefficients of thermal expansion between the semiconductor chip and an external connection substrate (a mounting substrate). In addition, if the stress absorption layer is formed in the state in which the gap preservation member is interposed, the stress absorption layer can be formed in a state in which the gap is reliably held, and thus the stress absorption layer can be formed easily and also reliably.

Stress relief is particularly effective if the stress absorption layer is provided in at least a region corresponding to the external electrode formation portion.

The gap preservation member could be provided by printing a resin. For example, this gap preservation member could be formed by using a screen-printing method to print a solder resist. If a printing method is used, an existing printing device could be adapted therefor, which is advantageous because it makes it possible to reduce the costs of fabrication.

Alternatively, the gap preservation member could be provided by the ejection of a resin by an ink-jet method. The ink-jet method in such a case is a method that is widely used in printers, for printing marks on defective products after semiconductor chips have been inspected, for example. In this method, a nozzle is used, and fine particles of resin ejected from that nozzle are blown towards the object to be printed. Note that a resin that does not clog the head should be used with this ink-jet method. If such an ink-jet method is used, many of the preparation steps that are required before printing (such as setting the ink, squeegee, or plate) become unnecessary, enabling a further shortening of the process than the printing method. Since the gap preservation member can be provided with no mechanical contact with the active surface, even if it is formed on the active surface side of the semiconductor chip, for example, this is preferable from the viewpoint of security of the active surface of the semiconductor chip.

When an ink-jet method is used, it is particularly preferable that the gap preservation member is provided only on the surface of the semiconductor chip that has the electrodes. Positional accuracy between the head and the object to be printed is usually required with an ink-jet method. A semiconductor chip is particularly useful as regards positional accuracy, because it has a rigid substrate. In addition, if an ink-jet method is employed, it is possible to use a device that puts bad marks on a surface to indicate a defective semiconductor chip, thus enabling the adaptation of existing equipment therefor.

The stress absorption layer could be formed by injecting a molding material. Injection of a molding material makes it possible to form the stress absorption layer in a region that is enclosed by the overlapping semiconductor chip and flexible substrate. In addition, the resin can be spread reliably between the semiconductor chip and the flexible substrate, ensuring that there are no voids between the surface of the semiconductor chip and the flexible substrate, preventing the accumulation of moisture, and also preventing corrosion.

A thermosetting resin could be used as this resin. Alternatively, an ultraviolet-setting resin could be used as this resin.

A material having properties of absorbing stresses between the semiconductor chip and the flexible substrate could be used as the gap preservation member, and the material also forms a stress absorption layer by hermetically sealing the opposing surfaces of the semiconductor chip and the flexible substrate.

In such a case, the gap preservation member is also formed as a stress absorption layer by hermetically and reliably sealing the two opposing surfaces of the semiconductor chip and the flexible substrate.

This configuration makes it possible to shorten the process, because the gap preservation member also functions as a stress absorption layer.

Since molding materials are expensive, making their use unnecessary leads to a reduction in costs.

The gap preservation member could also have thermoplastic properties, and the step of forming a stress absorption layer could comprise a step of applying heat and pressure to the gap preservation member. Since this gap preservation member has thermoplastic properties, the application of heat thereto forms a stress absorption layer. The gap preservation member also makes it easy for the completed semiconductor device to absorb stresses when heat is applied thereto.

During the step of applying pressure, it is preferable that the position at which pressure is applied to the gap preservation member is gradually shifted, to perform a sequence of local pressure applications.

This gap preservation member is preferably provided only on a surface of the flexible substrate disposed towards the surface of the semiconductor chip that has electrodes.

The step of providing the gap preservation member preferably comprises a step of forming a wiring pattern that is provided on a semiconductor chip side of the flexible substrate, wherein a plurality of protrusions is formed on the wiring pattern during the step of forming the wiring pattern, by etching predetermined locations.

This makes it possible to form the gap preservation member during the step of forming the wiring pattern, thus enabling a shortening of the process.

The configuration could be such that through holes are provided in the flexible substrate at positions corresponding to the protrusions, and the external electrodes are provided through the through holes on a surface opposite to the surface of the flexible substrate on which the wiring pattern is provided.

An insulating resin could be painted onto positions of the protrusions acting as the gap preservation member corresponding at least to the semiconductor chip.

A semiconductor device that has been made by the above described method comprises:

a semiconductor chip having electrodes;

a flexible substrate disposed over and overlapping the semiconductor chip with a predetermined gap therebetween, the flexible substrate having external electrode formation portions within the overlapping region, the flexible substrate having connection portions electrically connected to the external electrode formation portions, the connection portions connected to the electrodes of the semiconductor chip; and a gap preservation member provided at a position which excludes a position corresponding to the external electrode formation portions, the gap preservation member preserving the gap.

The active region of the semiconductor chip is preferably positioned within the overlapping region of the flexible substrate. This configuration makes it possible to add a function of protecting the active surface of the semiconductor chip-without increasing the number of components, by causing the active region of the semiconductor chip to be protected by the flexible substrate.

In additions a stress absorption layer could be positioned between the semiconductor chip and the flexible substrate.

Furthermore, the stress absorption layer could be provided in a position corresponding to the external electrode formation portion.

In particular, this gap preservation member could be formed by using at least part of the wiring pattern of the flexible substrate.

It is particularly preferable that a plurality of protrusions are provided in the wiring pattern, at least one of the plurality of protrusions forms the gap preservation member, and at least one of the rest of the protrusions forms a connection portion to an electrode of the semiconductor chip.

External electrodes could be formed on a side of the flexible substrate, the side of the flexible substrate being opposite to a side where the wiring pattern is formed, the external electrodes formed corresponding to a position where the at least one of the protrusions as the gap preservation member is formed.

The gap preservation member could be formed of resin and also function as the stress absorption layer. In such a case, the resin could be a thermoplastic resin.

It is possible to mount the above described semiconductor device on a circuit board. In other words, in a circuit board on which the above semiconductor device is mounted, any of the above described semiconductor devices is electrically connected thereto by external electrode formation portions of the semiconductor device.

In addition, external electrodes that are formed on this external electrode formation portion could be connected directly to connecting portions of the circuit board.

A flexible substrate used in a semiconductor device is a flexible substrate comprising:

a base portion; and a wiring pattern provided on one surface of the base portion, the wiring pattern having a plurality of protrusions formed integrally thereon, the base portion having through holes formed therein, each of the through holes corresponding to a position at which each of the plurality of protrusions are provided.

The plurality of protrusions preferably form connection portions to electrodes of the semiconductor chip and also a gap preservation member and an insulating layer is preferably provided on a surface of the protrusions corresponding to the gap preservation member.

Alternatively, the flexible substrate could comprise:

connection portions, the connection portions connected to electrodes of a semiconductor chip; and a gap preservation member made of resin, the gap preservation member provided on a side where the connection portions are provided, the gap preservation member provided at a position that excludes the connection portions. The gap preservation member could be made from a thermoplastic resin.

BEST MODE FOR CARRYING OUT THE INVENTION

Preferred embodiments of this invention are described below with reference to the drawings.

(First Embodiment)

Figure 1:
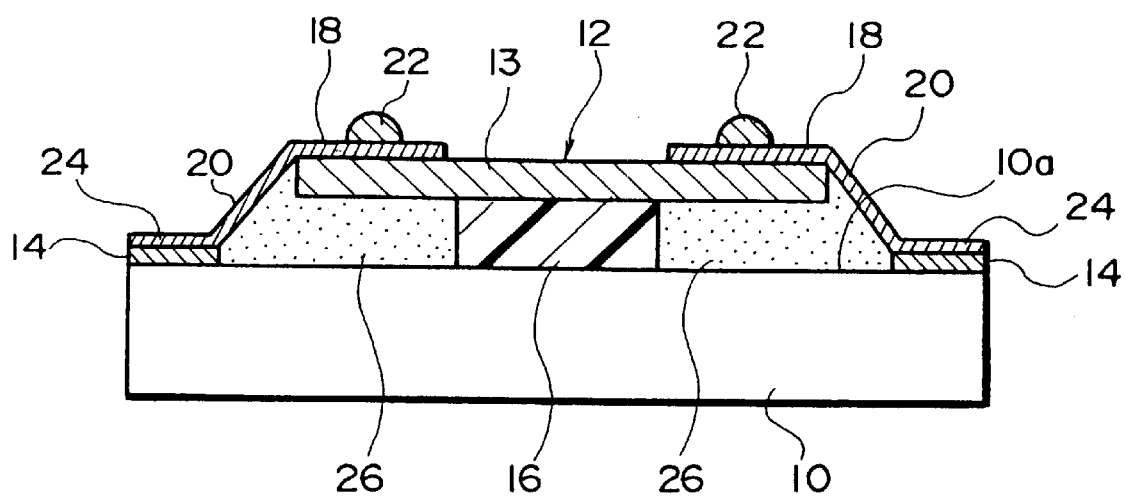
FIG. 1 is a cross-sectional view of a semiconductor device in accordance with a first embodiment.

FIG. 1 is a cross-sectional view through a semiconductor device in accordance with a first embodiment of this invention. This semiconductor device is covered with a flexible substrate 12 on a surface side, that is, an active surface side, of a semiconductor chip 10. Therefore, the planview size of the package is substantially close to the chip size.

The semiconductor chip 10 is of a peripheral type wherein a plurality of electrodes 14 are provided around four peripheral edge portions of a rectangular active surface 10a. Note that the end portions of the electrodes 14 are drawn in this figure as matching the end portions of the semiconductor chip 10, but in practice the end portions of the electrodes 14 would be disposed at positions that are slightly retracted from the end portions of the electrodes 14. However, there would be no problem on packaging the semiconductor chip on which is disposed electrodes as shown in this figure. It should be noted that this embodiment could equally well be applied to a semiconductor chip in which the electrodes are provided on only one, two, or three of the edges of the active surface.

A gap preservation member 16 is disposed above the active surface 10a. The gap preservation member 16 is formed of a material such as solder resist, but it could also be formed of a thermosetting or ultraviolet-setting resin. The gap preservation member 16 could be formed of another material, irrespective of its adhesiveness, provided it has the property of maintaining a consistent shape after bonding, even if external energy (such as heat or pressure) is applied thereto during the bonding. The height of the gap preservation member 16 is preferably as tall as possible, from the viewpoint of a structure capable of relieving the stresses between the substrate to be mounted and the semiconductor chip 10. However, if the height is too great, the external dimensions of the completed semiconductor device will naturally increase. In addition, some form of contrivance may necessary for this gap. If it is necessary to inject resin or the like between the semiconductor chip 10 and the flexible substrate 12 in order to protect the outer surface of the semiconductor chip 10 or provide stress relief (details will be given later), for example, the height of the gap preservation member 16 is preferably within the range of about 10 to 30 μm, more preferably within the range of 20 to 30 μm, to ensure that this injection is not obstructed and also to obtain a gap of a certain degree.

The flexible substrate 12 is attached on the gap preservation member 16. Since the flexible substrate 12 is designed to have a wiring pattern of approximately 5 to 35 μm thick on a thin-film base portion (generally of a thickness of approximately 25 to 125 μm), it bends easily into a wavy shape, so it easily curls. In this embodiment, the presence of the gap preservation member 16 between the semiconductor chip 10 and the flexible substrate 12 makes it possible to attach the flexible substrate 12 without its bending. It also ensures that a uniform gap is formed between the flexible substrate 12 and semiconductor chip 10, while ensuring that the flexible substrate 12 does not bend. The gap preservation member 16 keeps a predetermined space between the active surface 10a and the flexible substrate 12, and supports the flexible substrate 12.

In this respect, the technique disclosed in International Publication WO95/08856 relates to the attachment of a flexible substrate during the bonding to the leads. There is no gap preservation member 16 in that case, so it is difficult to form a uniform gap and thus it is not possible to attach the flexible substrate 12 without it bending. This means that a region is formed between the flexible substrate and the semiconductor chip where it is not possible to inject resin. In addition, this shifts the flexible substrate, causing the external electrodes to be shifted.

In this embodiment, the intervention of the gap preservation member 16 makes it possible to attach the flexible substrate 12 at the correct position, without its bending. This also makes it possible to do batch-bonding of a plurality of leads 20. Note that it is sufficient to provide the gap preservation member 16 only at a position where the flexible substrate 12 might bend, from the point of view of preventing it from bending.

The provision of the gap preservation member 16 in the center of the flexible substrate 12, makes it easy to inject a molding material, to form a stress absorption layer 26 and/or protect the active surface of the semiconductor chip. Alternatively, if the gap preservation member 16 is provided at an end portion of the flexible substrate 12, that would increase the effect of preventing bending in the flexible substrate 12. There are therefore no limits on the position of the gap preservation member 16, provided that a gap is formed between the flexible substrate 12 and the active surface 10a of the semiconductor chip. It should be noted, however, that if stress relief is to be considered, it is preferable that the gap preservation member 16 avoids the region directly below the external electrodes 22. This ensures that the stress absorption layer 26 is formed below the external electrode 22, which is effective for absorbing thermal stresses. It is also preferable that the gap preservation member 16 is provided over as small a region as possible, to ensure that a wide stress absorption layer 26 is formed Note that the region in which the gap preservation member 16 is provided is determined from factors such as the ease of flection of the flexible substrate 12. For example, if the flexible substrate 12 is thin and easy to bend, the gap preservation member 16 could avoid only the regions directly under the external electrodes 22 and could be provided over the entire remainder of the active surface of the semiconductor chip.

The flexible substrate 12 is either slightly smaller than the active surface 10a of the semiconductor chip 10 when mounted, or it is of the same shape. The flexible substrate 12 is designed to have a wiring pattern 18 on a base portion 13, with the wiring pattern protruding from the outer periphery of the base portion 13. Note that the portions of the wiring pattern 18 that protrude from the outer periphery of the base portion are called the leads 20. The external electrodes 22 are provided on the wiring pattern 18. Note that a location on the wiring pattern 18 where the external electrodes 22 are provided is called an external electrode formation portion. Note also that with this embodiment a region that is slightly wider than the width of the wiring pattern is ensured as this external electrode formation portion, to be used as lands. These external electrodes in this case are provided within a range that does not exceed the semiconductor chip 10, in other words, they lie within the area of the semiconductor chip. At least one of these external electrodes is provided within this area; at most all of the external electrodes are provided within this area. In this example, solder in ball or paste form is used as the external electrodes 22. Note that, in addition to forming the external electrodes of solder alone, a material that improves the height accuracy thereof could be used. For example, a conductive material such as copper, silver, gold, or the like that maintains its shape at the melting temperature of solder, in other words, a material that has a melting temperature greater than that of solder, could be used therefor. To enable the connection to the external. substrate in this case, the material could be formed into balls with its outer peripheries covered in solder, or the solder could be applied beforehand on the side to be mounted of the external substrate.

The leads 20 are bent and the tips of these leads are used as connection portions 24 facing the electrodes of the semiconductor chip 10. In other words, the connection portions 24 are connected to the electrodes 14 of the semiconductor chip 10.

The stress absorption layer 26 is then formed between the flexible substrate 12 and the semiconductor chip 10. The stress absorption layer 26 is formed by injection of a molding material. This formation of the stress absorption layer 26 over the outer surface of the active surface 10a of the semiconductor chip 10 protects the active surface 10a. It can also prevent corrosion. The stress absorption layer 26 also has electrical insulating properties, which makes it possible to prevent electrical conduction between the active surface 10a of the semiconductor chip 10 and the exterior. The stress absorption layer 26 also has thermoplastic properties. This means that the stress absorption layer 26 can absorb any thermal stresses caused by the difference in the coefficients of thermal expansion of the flexible substrate 12 and the semiconductor chip 10.

The gap preservation member 16 and the stress absorption layer 26 are formed separately in this embodiment, so the optimal materials can be used for each of them.

If the surface area occupied by the gap preservation member 16 becomes large in the gap, giving flexibility to the gap preservation member 16 increases the reliability, the stress absorption layer 26 multiplying the effect.

Note that this figure shows a structured of the semiconductor chip 10, the base portion 13 and the wiring pattern 18, seen from the semiconductor chip side, in such a manner that the semiconductor chip 10 and the base portion 13 face each other. However, the provision of a material having electrical insulation properties such as the gap preservation member or the stress absorption layer, as in this example, enables the base portion and the wiring pattern to be reversed, in other words, the semiconductor chip 10 and the wiring pattern to be provided facing each other. Note further that in this case, through holes must be provided in the base portion, to allow electrical conduction between the wiring pattern and the external electrodes 22.

The description now turns to the method of making the above described semiconductor device. First of all, the flexible substrate 12 provided with the wiring pattern 18, the leads 20, and the external electrodes 22 is prepared. Note that the wiring pattern 18 and the leads 20 must be already formed at this stage, but this does not mean it is absolutely necessary that the external electrodes 22 have been formed at this stage. The external electrodes 22 could equally well be provided in a subsequent step, such as after the connection of the flexible substrate to the semiconductor chip. In this case, the leads 20 could be in a state in which they extend straight outward from the wiring pattern 18, not in the curved state shown in FIG. 1. It is preferable that solder resist is then applied to the regions on the wiring pattern 18 where the external electrodes 22 are not to be provided, to ensure electrical insulation from the outside. This flexible substrate 12 is formed in such a manner as to have an overlapping region above the active surface side of a semiconductor chip when it is assembled therewith as a semiconductor device. In particular, the base portion of the flexible substrate is positioned in an overlapping region. External electrode formation portions for the formation of external electrodes are formed above the base portion of this overlapping region. This configuration conforms to a standard called the chip size/scale package, which makes it possible to form the external electrodes within the area of the semiconductor chip.

The gap preservation material (gap preservation member) 16 is provided on the flexible substrate 12. More specifically, the gap preservation material 16 is provided on a surface of the flexible substrate facing the surface of the semiconductor chip having the electrodes 14, which in this figure is the surface on the opposite side of the flexible substrate 12 from the surface on which the wiring pattern 18 is formed. In other words, the gap preservation material 16 is provided on the surface on which are positioned the connection surfaces of the connection portions 24 of the leads 20 that connect to the electrodes 14. The fabrication of the gap preservation material 16 is done by painting or ejecting a resin by a screen-printing or ink-jet method. Alternatively, the gap maintenance could be provided by adhesion. Solder resist or a thermosetting or ultraviolet-setting resin is used as the resin, and, if necessary, it is exposed to heat or ultraviolet rays. If the gap preservation material 16 is formed of solder resist, a step of forming the gap preservation material 16 can be performed continuously before or after the step of applying the solder resist to the flexible substrate 12. This makes it possible to smooth the work. In this case, the solder resist applied to the flexible substrate 12 also acts as a protective film that protects the leads 20 both electrically and mechanically.

Note that the gap preservation material 16 need not be provided on the side of flexible substrate 12; it could be provided on the side of the semiconductor chip; or it could equally well be provided on both sides. Note also that if the gap preservation material 16 is provided on the semiconductor chip side, it is preferable to use an ink-jet method therefor. This is because application by an ink-jet method makes it possible to provide the gap preservation material 16, without requiring the direct contact with the outer surface of the semiconductor chip, as in a printing method. An ink-jet method is also preferable from the viewpoint of ease of meeting the requirement for positional accuracy of the semiconductor chip. That is to say, it is necessary to accurately set the distance between the nozzle and the object to be printed (in this case, the semiconductor chip) if an ink-jet method is used, so from this sense it is a useful method for a semiconductor chip that is formed from a rigid substrate. The ink-jet method is also extremely advantageous in reducing costs, in that it enables the use of a marking device which is generally used for adding markings to defective semiconductor chips and it makes it possible to restrain installation costs by using ordinary techniques and devices.

During the step of forming the gap preservation material 16, the gap preservation material 16 is formed at a position that excludes the region corresponding to the external electrodes 22.

The flexible substrate 12 is then placed on the semiconductor chip 10, with the gap preservation material 16 therebetween The connection portions 24 are connected to the electrodes 14 of the semiconductor chip 10, while the leads 20 are bent. In this case, a plurality of the leads 20 are provided on the flexible substrate 12, and all of the leads 20 are bonded to the electrodes 14 in a batch. An ordinary device is used for this bonding. Note that various methods of bonding a plurality of leads in a batch are well known, so detailed description thereof is omitted. Note also that it is preferable to use batch bonding (called "gang bonding") from the viewpoint of mass productivity, but this does not mean that only batch bonding can be used; single-point bonding could also be used.

A molding material is then injected between the semiconductor chip 10 and the flexible substrate 12. More specifically, the molding material is injected into either holes (not shown in the figure) formed in the flexible substrate 12 or by using gaps between adjacent leads 20. The molding material could be in a gel form but it preferably tends to be hardened to a certain degree. In the completed semiconductor device, this molding material forms the stress absorption layer 26. If this stress absorption layer 26 is provided, it may be preferably provided at a position at least directly below the external electrodes 22.

In this manner, this embodiment ensures that a gap can be provided by the gap preservation material 16 between the semiconductor chip 10 and the flexible substrate 12. This gap is for forming the stress absorption layer 26. The preparation for exclusive equipment is unnecessary to provide this gap. In addition, a plurality of leads 20 can be bonded in a batch by using an ordinary device.

Note that if a gap preservation material is provided beforehand on the semiconductor chip side, as in this example, the flexible substrate 12 can be used in the first embodiment shown in FIG. 1.

(Second Embodiment)

Figure 2:
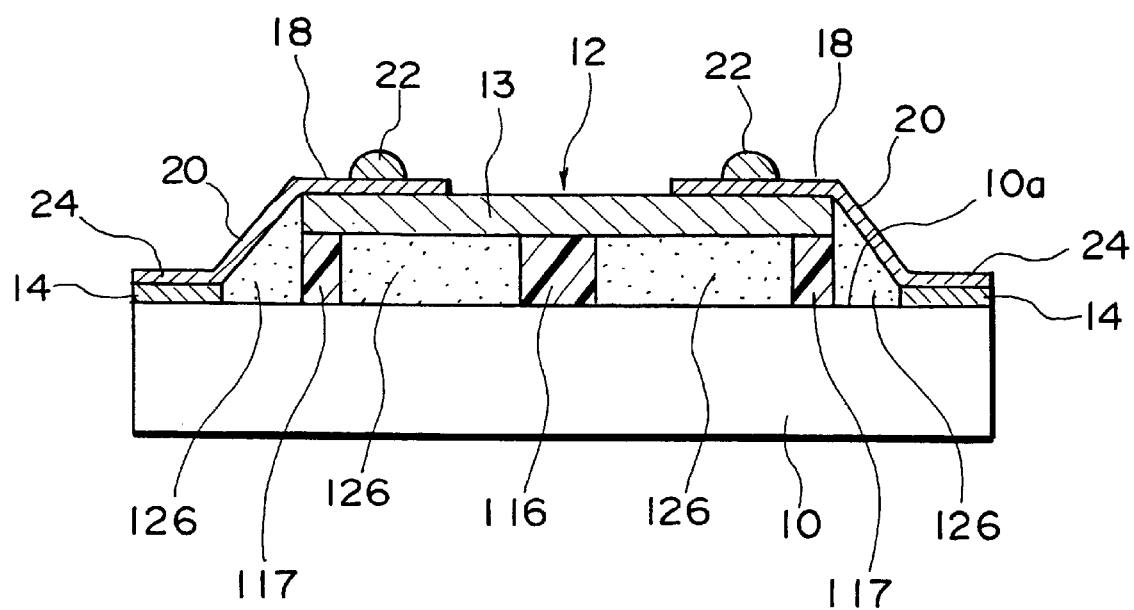
FIG. 2 is a cross-sectional view of a semiconductor device in accordance with a second embodiment.

FIG. 2 is a view showing a semiconductor device in accordance with a second embodiment. The semiconductor device shown in this figure is characterized in having gap preservation materials 116 and 117 and a stress absorption layer 126. Other components are similar to those of the semiconductor device of FIG. 1, so they are given the same reference numbers and further description thereof is omitted.

The gap preservation materials 117 are provided at end portions of the flexible substrate 12 in FIG. 2. This ensures that the end portions of the flexible substrate 12 are supported, so that the gap preservation material 116 provided at the center of the flexible substrate 12 can be made smaller. Note that if the gap preservation material 116 is used to the maximum, the maximum possible disposition region thereof is all the regions that excludes the regions directly below the external electrodes. Therefore, separate gap preservation materials 116 and 117 can be used at each location, but when they are disposed over the maximum size of region, the parts thereof could be made integral (connected except parts thereof, although this is not shown in the figure). In other words, the configuration could be such that holes are formed at corresponding locations, that is, only at positions that correspond to regions directly below the external electrodes.

This makes it possible to form the stress absorption layer 126 in the regions directly underneath the external electrodes 22, enabling a more efficient absorption of stresses. In this embodiment, the leads 20 that extend from the end portions of the flexible substrate 12 are bent, and the gap preservation materials 117 are provided at the end portions of the flexible substrate 12. Therefore, when the leads 20 are being bent, the resultant stresses can be taken by the gap preservation materials 117 and thus the step of bonding the leads 20 can be performed satisfactorily. Note that, if external pressure will be applied to the leads 20 so as to bend them, it is better to provide the gap preservation materials 117 at the end portions of the base portion in Particular. However, if external pressure is applied to the flexible substrate during bonding, for example, even if the leads 20 are not bent thereby, providing the gap preservation materials 117 ensures greater reliability.

FIG. 2 is a view showing a method of making a semiconductor device in accordance with the second embodiment and its making method is substantially the same as that described in the first embodiment. In other words, the method of making the gap preservation material is changed slightly by the increase in regions over which the gap preservation materials are provided. There would be no problem whether the gap preservation materials 116 and 117 are formed together or separately. In addition, they could be formed continuously (in a connected state) or discontinuously at individual locations.

(Third Embodiment)

Figure 3:
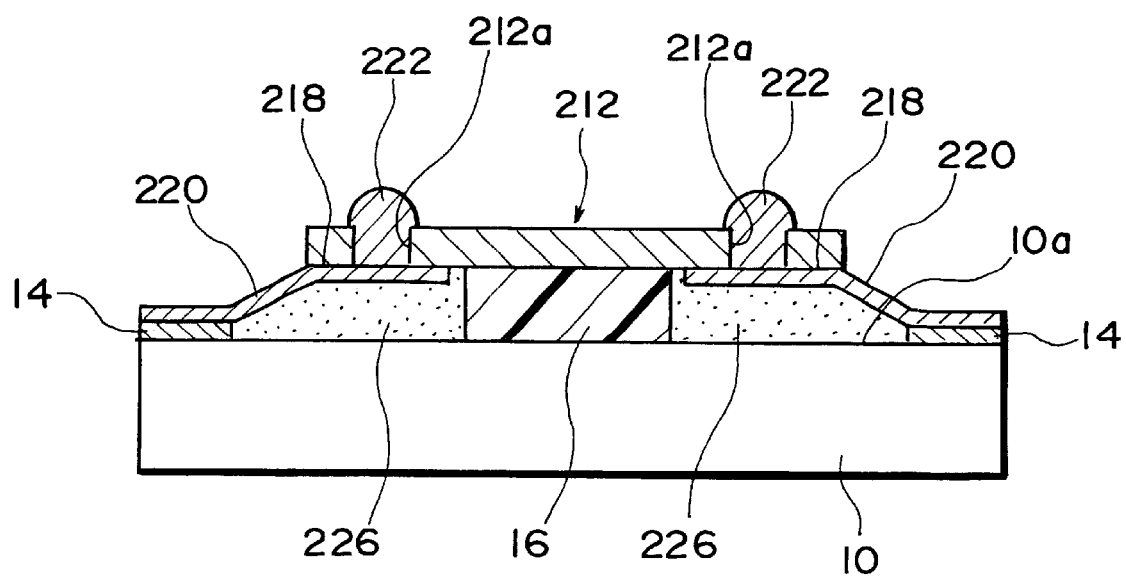
FIG. 3 is a cross-sectional view of a semiconductor device in accordance with a third embodiment.

FIG. 3 is a view showing a semiconductor device in accordance with a third embodiment. The semiconductor device shown in this figure is a variant of the semiconductor device shown in FIG. 1, so the same components are given the same reference numbers and further description thereof is omitted.

In FIG. 3, a wiring pattern 218 is formed on an active surface 10a side of a flexible substrate 212. Through holes 212a are formed in the flexible substrate 212, and external electrodes 222 are formed protruding, through the through holes 212a, from the wiring pattern 218 to its opposite side. Leads 220 protrude from end portions of the flexible substrate 212. These leads 220 are bent at a gentler angle than the leads 20 of FIG. 1, and are connected to the electrodes 14.

A stress absorption layer 226 is also provided in this embodiment between the flexible substrate 212 and the active surface 10a in such a manner that thermal stresses are absorbed thereby. Since the wiring pattern 218 is formed on the side on which the stress absorption layer 226 is provided in this embodiment, the wiring pattern 218 is protected by the stress absorption layer 226. This makes it possible to omit the step of forming a protective film for the wiring pattern 218. Note that the positions at which the gap preservation material is provided could correspond to any of the positions described with reference to the other embodiments.

The fabrication method thereof is substantially the same as that described with reference to the first embodiment. This fabrication method differs from that of the first embodiment in that a flexible substrate of a slightly different shape is prepared and the surface thereof that faces the semiconductor chip is disposed opposite to the direction shown in FIG. 1.

(Fourth Embodiment)

Figure 4:
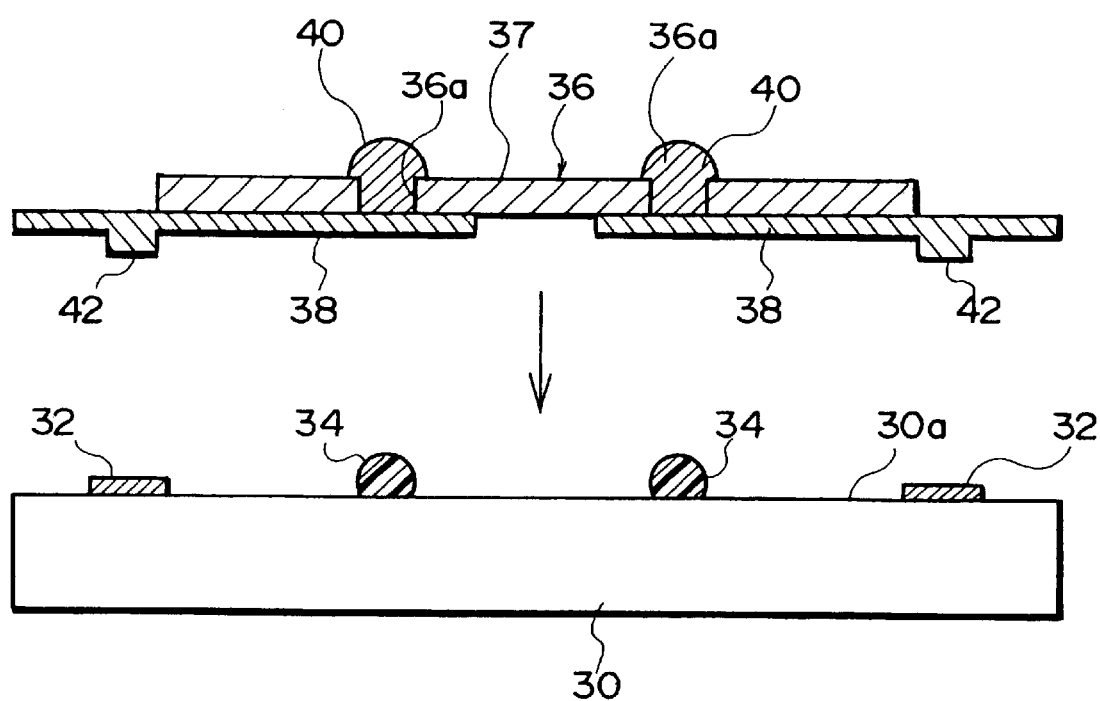
FIG. 4 is a cross-sectional view of a method of making a semiconductor device in accordance with a fourth embodiment.

FIG. 4 is a cross-sectional view of a method of making a semiconductor device in accordance with a fourth embodiment. The semiconductor chip 30 used in this embodiment is similar to the semiconductor chip 10 of FIG. 1 and has electrodes 32. In this embodiment, gap preservation materials 34 are provided beforehand on an active surface 30a of the semiconductor chip 30. In other words, resin is applied or ejected thereonto by screen-printing or an ink-jet method, to form the gap preservation materials 34 on the semiconductor chip 30 before the connection to the leads 220 of the flexible substrate.

A flexible substrate 36 is then placed on the semiconductor chip 30, with the gap preservation materials 34 therebetween, and a stress absorption layer (not shown in the figure) is formed by the injection of a molding material to make the semiconductor device.

In this case, the flexible substrate 36 is provided with a wiring pattern 38 on a surface of its base portion 37 on the semiconductor chip 30 side. Solder bumps 40 are then provided as external electrodes on the wiring pattern 38. The solder bumps 40 project from through holes 36a formed in the base portion 37 to the surface opposite to the surface on the semiconductor chip 30 side. Note that this does not mean that the solder bumps 40 must be provided at this stage; they could equally well be provided at a later stage, such as after the connection of protrusion 42 to the electrodes 32 has ended. The protrusions 42 are formed in the wiring pattern 38 at positions corresponding to the electrodes 32 of the semiconductor chip 30. These protrusions 42 are formed by etching the wiring pattern 38. It should be noted, however, that it is not necessary to insist on etching as the protrusion formation method; known methods other than etching could be used therefor, such as the formation of bumps by a transcribing bump method. These protrusions 42 act as connection portions to be bonded to the electrodes 32 of the semiconductor chip 30. In this case, the flexible substrate shown in this figure, particularly the wiring pattern thereof, is disposed in substantially a straight line with no bending. This ensures that no external stresses are exerted on the wiring pattern 38, making it possible to design for an improvement in reliability wherein cracking or the like is unlikely to occur.

The height of the gap preservation materials 34 is substantially the same as or less than the total height of the protrusions 42 and the electrodes 32, such that the connections between the protrusions 42 and the electrodes 32 are not impeded. The protrusions need not be provided on the wiring pattern 38 side; this case could be dealt with, forming bumps on the electrodes 32 of the semiconductor chip 30.

In this embodiment, the wiring pattern 38 is provided on the semiconductor chip 30 side of the base portion 37. In other words, the wiring pattern 38 is provided between the base portion 37 and the semiconductor chip 30. This ensures electrical insulation by a stress absorption layer (not shown in the figure) formed by the gap preservation materials 34 together with a molding material (resin), even if the wiring pattern 38 is not covered by solder resist or the like.

In this embodiment, the gap preservation materials 34 are provided in direct contact with the semiconductor chip 30. As described above, the gap preservation materials 34 are provided by means such as printing, so they adhere to the active surface 30a. Therefore, no gap is formed between the active surface 30a and the gap preservation materials 34. If the active surface 30a is covered by the stress absorption layer, all of the region of the active surface 30a apart from the electrodes 32 can be covered by resin, so there are no regions into which water can collect, improving the humidity-related reliability thereof.

As a variation of this embodiment, the gap preservation materials 34 could be provided beforehand on the flexible substrate 36. In such a case, the gap preservation materials 34 could be formed by using solder resist during a step of forming a protective film on the wiring pattern 38 formed on the flexible substrate 36, such as a step of printing solder resist thereon. In particular, the gap preservation materials 34 can be formed by simply forming protrusions in the protective film of the wiring pattern 38, because the flexible substrate 36 of this embodiment has a wiring pattern 38 formed on its side towards the active surface 30a of the semiconductor chip 30.

Note that when gap preservation materials are provided beforehand on the semiconductor chip side, as in this example, the flexible substrate 12 used in the first embodiment of FIG. 1, in other words, a substrate in which the wiring pattern is placed on the outer side, can be used without modification.

(Fifth Embodiment)

Figure 5:
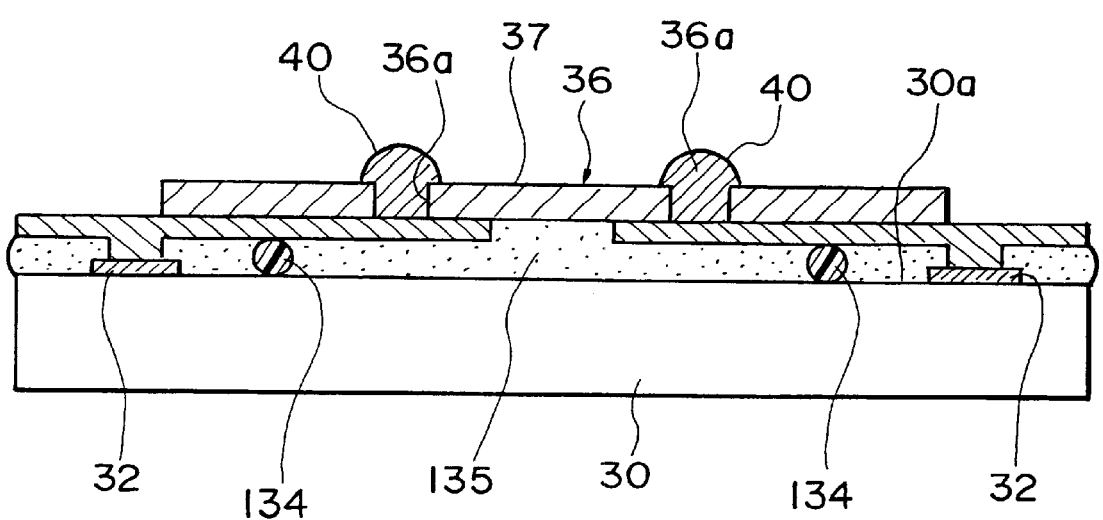
FIG. 5 is a cross-sectional view of a semiconductor device in accordance with a fifth embodiment.

FIG. 5 is a view showing a semiconductor device in accordance with a fifth embodiment. The semiconductor device shown in this figure has gap preservation materials at positions that differ from those of the semiconductor device made by the process shown in FIG. 4, but it otherwise has the same configuration, so that similar components are given the same reference numbers and further description thereof is omitted.

In FIG. 5, gap preservation materials 134 are provided at positions that avoid the regions directly below the solder bumps 40. More specifically, they are provided close to the end portions of the flexible substrate 36. This configuration makes it possible to provide a stress absorption layer 135 directly below the solder bumps 40. Thermal stresses applied to the solder bumps 40 can be absorbed directly below the solder bumps 40.

(Sixth Embodiment)

Figure 6A:
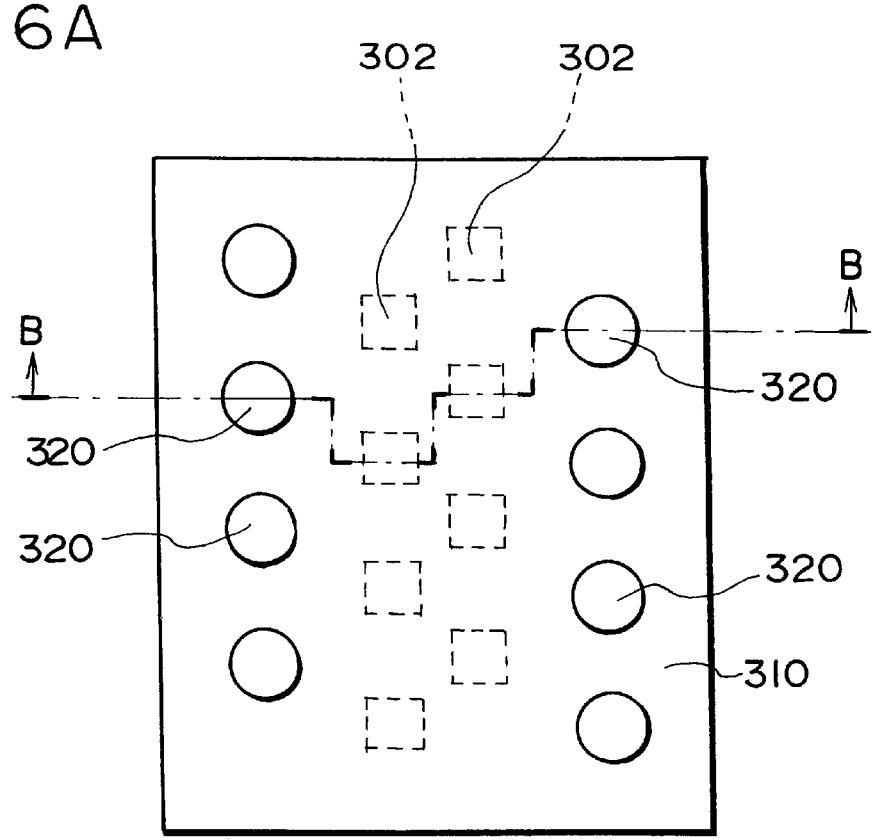
FIGS. 6A and 6B are a plan view and a cross-sectional view of a semiconductor device in accordance with a sixth embodiment.
Figure 6B:
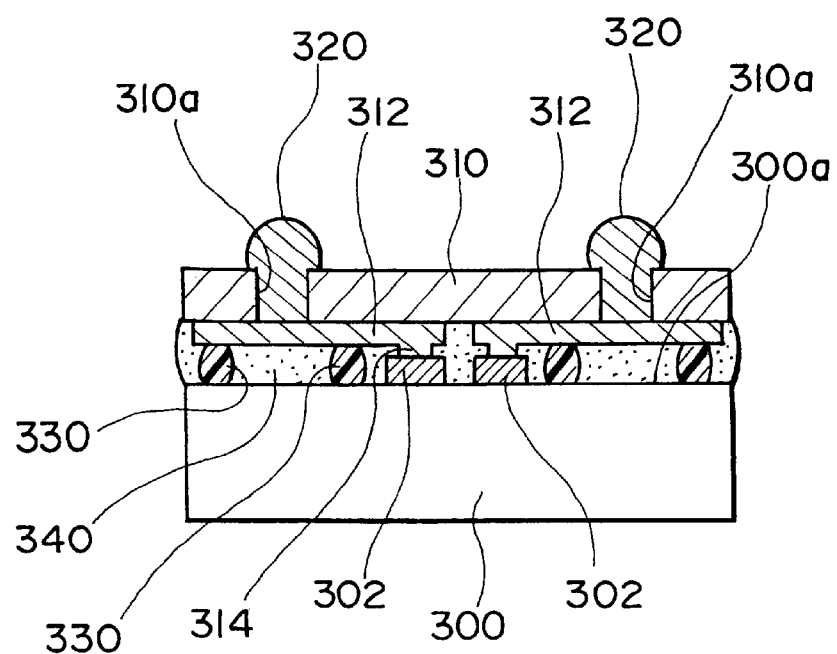

FIG. 6A is a plan view of a semiconductor device in accordance with a sixth embodiment and FIG. 6B is a cross-sectional view taken along the line B—B in FIG. 6A.

In this semiconductor device, a plurality of the electrodes 302 is provided in a zigzag pattern at the center of a semiconductor chip 300. A wiring pattern 312 is formed on a flexible substrate 310 on a side facing an active surface 300a of the semiconductor chip 300. Protrusions 314 to be connected to the electrodes 302 are formed in the wiring pattern 312, and also external electrodes 320 are formed through a plurality of through holes 310a that are formed in the flexible substrate 310.

In this embodiment too, a stress absorption layer 340 is provided between the flexible substrate 310 and the active surface 300a, with gap preservation materials 330 therebetween. More specifically, the gap preservation materials 330 are provided to avoid the regions directly below the external electrodes 320, so that the stress absorption layer 340 can be formed directly below the external electrodes 320. Thus thermal stresses can be efficiently absorbed. Note that this invention can be applied to an array type semiconductor chip in which the electrodes are arranged in an array of a plurality of lines and a plurality of columns, in a similar manner to that of this embodiment.

(Seventh Embodiment)

Figure 7:
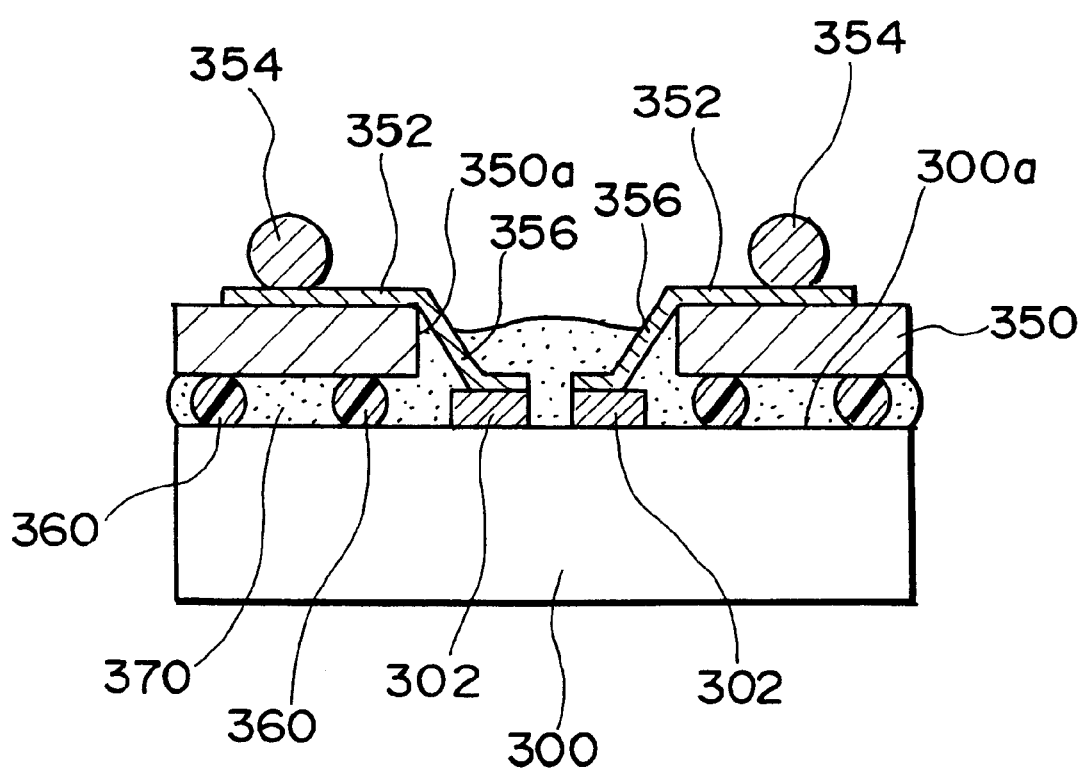
FIG. 7 is a cross-sectional view of a semiconductor device in accordance with a seventh embodiment.

FIG. 7 is a view showing a semiconductor device in accordance with a seventh embodiment. The semiconductor chip 300 shown in this figure is provided with a plurality of electrodes 302 in a zigzag pattern on the active surface 300a, in a similar manner to that shown in FIGS. 6A and 6B. A wiring pattern 352 is formed on a flexible substrate 350 on the side opposite to the active surface 300a, and external electrodes 354 are formed on the wiring pattern 352. Holes 350a are formed in the flexible substrate 350 in the vicinity of the electrodes 302, with leads 356 protruding into the interior of these holes 350a. These leads 356 are formed bent and are bonded to the electrodes 302.

In this embodiment too, a stress absorption layer 370 is provided between the flexible substrate 350 and the active surface 300a, with gap preservation materials 360 therebetween. More specifically, the gap preservation materials 360 are provided to avoid the regions directly below the external electrodes 354, so that the stress absorption layer 370 can be formed directly below the external electrodes 354. It is preferable that a gap preservation material 360 is disposed on the side of and to the end portion of a hole 350a, as shown in FIG. 2, to improve the bonding efficiency.

(Eighth Embodiment)

Figure 8:
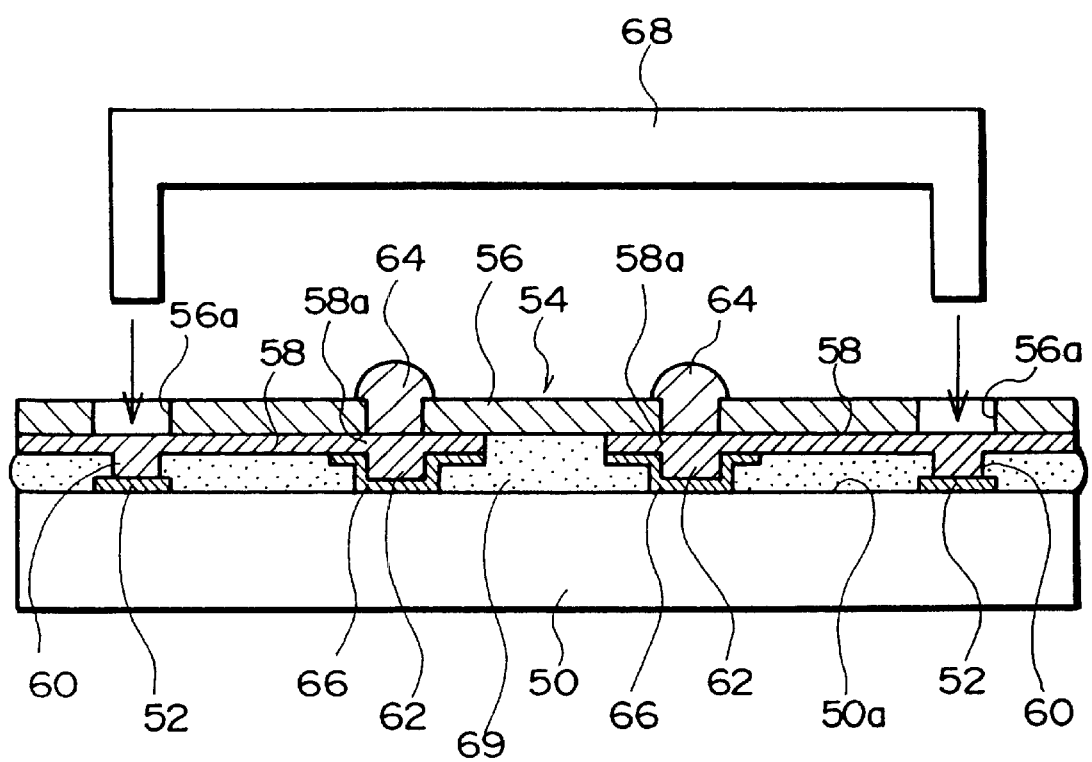
FIG. 8 is a cross-sectional view of a semiconductor device in accordance with an eighth embodiment.

FIG. 8 is a cross-sectional view of a method of making a semiconductor device in accordance with an eighth embodiment. In this figure, a semiconductor device that is a completed product has a semiconductor chip 50, a flexible substrate 54, and a stress absorption layer 69. The semiconductor chip 50 is similar to the semiconductor chip 10 of FIG. 1 and has electrodes 52.

The flexible substrate 54 has a base portion 56 and a wiring pattern 58 provided thereon. Solder bumps 64 are provided on the wiring pattern 58, in a similar manner to the embodiment of FIG. 4. Note that, in order to provide these solder bumps 64, aperture portions are formed in the base portion, and pad regions 58a are formed by using the wiring as is. These pad regions 58a are generally formed to be slightly larger than the pattern width, to provide the external electrodes. The wiring pattern 58 is provided on the rear surface side of the flexible substrate 54, in a manner similar to that of the embodiment of FIG. 4, so that it is not exposed to the exterior and is thus protected.

A plurality of protrusions 60 and 62 are formed in the wiring pattern 58. The protrusions 60 are used as connection portions with the electrodes 52 of the semiconductor chip 50. More specifically, a bonding tool 68 is inserted into tool holes 56a formed in the base portion 56, and all of the protrusions 60 are bonded to the electrodes 52 in a batch. An ordinary device could be used as this bonding tool 68. In this case, the flexible substrate 54, particularly the wiring pattern 58, is disposed in substantially a straight line, without any bending, as shown in the figure. This ensures that no external stresses are exerted on the wiring pattern 58, making it possible to design for an improvement in reliability wherein cracking or the like is unlikely to occur.

The protrusions 62 are formed in the pad regions 58a of the wiring pattern 58, on the surface thereof opposite to the solder bumps 64. Since the pad regions 58a are comparatively wide, the protrusions 62 can also be formed to be large. Even so, if size is not a consideration, the protrusions 62 could be formed at positions other than the pad regions 58a. In such a case, the stress absorption layer 69 could be provided directly below the solder bumps 64, so that thermal stresses can be efficiently absorbed thereby. Note that the protrusions 62 could be formed integrally with the wiring pattern 58 or separately therefrom, in a similar manner to that described above with reference to the previous embodiments.

Solder resist 66 is then applied over the outer surfaces of the protrusions 62, to ensure electrical insulation from the active surface 50a. The solder resist 66 could extend slightly beyond the outer surfaces of the protrusions 62. Note that the protrusions 60 and 62 are formed by etching the outer surface of the wiring pattern 58. Therefore, when the protrusions 60 are formed as connection portions, the protrusions 62 can be formed at the same time, without increasing the number of etching steps.

The provision of the protrusions 62 and the solder resist 66 makes it possible to form a gap between the active surface 50a of the semiconductor chip 50 and the flexible substrate 54. In other words, the protrusions 62 and the solder resist 66 functions as a gap preservation material. A molding material can be injected into this gap to form the stress absorption layer 69. The total height of the protrusions 62 and the solder resist 66 is substantially the same as or the less than the total height of the protrusions 60 and the electrodes 52, such that the connections between the protrusions 60 and the electrodes 52 are not impeded.

The method of making the above described semiconductor device is described. First of all, the flexible substrate 54 having the wiring pattern 58 which has the protrusions 60 and 62 is prepared. The protrusions 60 and 62 could be either integral therewith or separate therefrom, as previously mentioned. Note, however, that an insulation process must be performed on the outer surfaces of the protrusions 62. The flexible substrate 54 is then placed on the semiconductor chip 50, and the protrusions 60 and the electrodes 52 are bonded together. A molding material is injected between the flexible substrate 54 and the semiconductor chip 50 to form the stress absorption layer 69, enabling the completion of the semiconductor device. Note that it does not matter whether the solder bumps 64 are formed before or after the connection (bonding) of the electrodes 52 and the protrusions 60. However, if the solder bumps are formed before the bonding, the bonding tool must be shaped to avoid the solder bumps, as shown in the figure.

This embodiment makes it unnecessary to use an exclusive jig and enables the mounting and assembly steps by ordinary assembly devices, restraining any increase in fabrication costs.

(Ninth Embodiment)

Figure 9A:
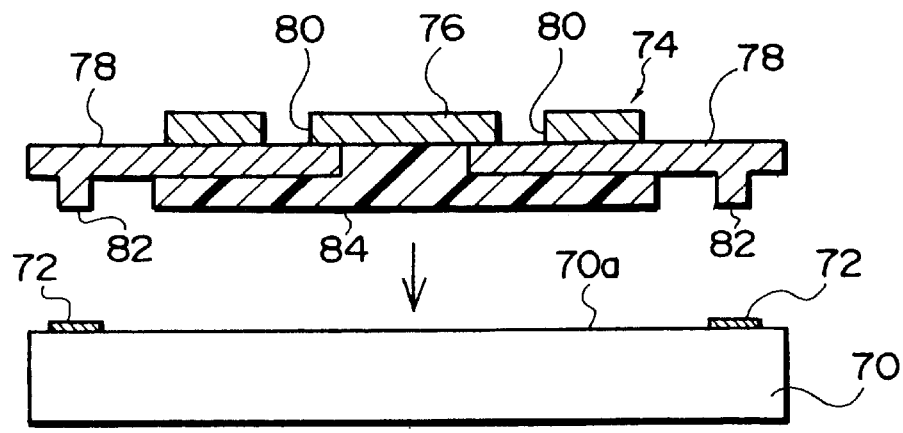
FIGS. 9A to 9C are views showing steps in the process of making a semiconductor device in accordance with a ninth embodiment.
Figure 9B:
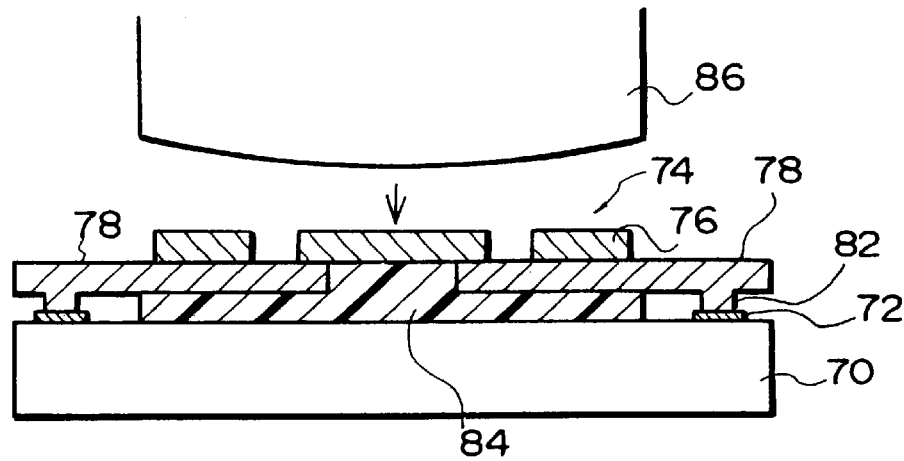
Figure 9C:
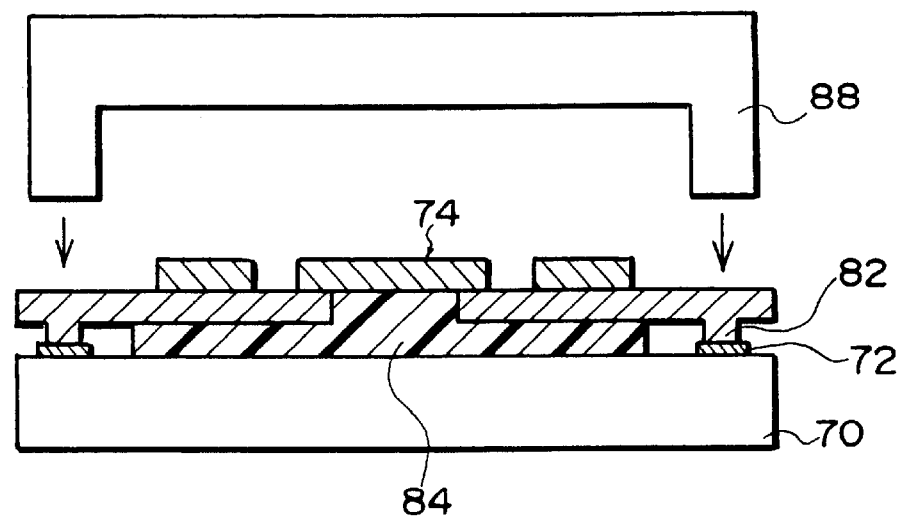

FIGS. 9A to 9C a view showing a method of making semiconductor device in accordance with a ninth embodiment.

A semiconductor chip 70 is a conventional one having electrodes 72 on an active surface 70a thereof. A flexible substrate 74 is provided with a wiring pattern 78 on a base portion 76 thereof. Through holes 80 are formed in the base portion 76. The through holes 80 are for the provision of solder bumps acting as external electrodes. These solder bumps are formed in the same manner as that illustrated in FIGS. 4 and 8, so further description and illustration thereof are omitted.

Protrusions 82 are formed in the wiring pattern 78 as connection portions to the electrodes 72. These protrusions 82 are also formed by etching.

The characteristic feature of this embodiment is the provision of an intervening layer 84 on the flexible substrate 74. Note that in this example the intervening layer 84 is provided on the flexible substrate 74, but the intervening layer 84 could also be provided beforehand on the semiconductor chip side.

This intervening layer 84 is provided by applying a flexible adhesive to the wiring pattern 78 of the flexible substrate 74. Alternatively, the intervening layer 84 could be previously formed as a tape that is then affixed to the wiring pattern 78. Alternatively, a tape having adhesive properties on only one surface thereof could be used as the intervening layer, and the wiring pattern could be formed by vapor deposition or the like on the other surface of the tape.

The intervening layer 84 fulfills the functions of a gap preservation member and a stress absorption layer. In other words, the intervening layer 84 is of a material that preserves a gap and it is also of a material that absorbs thermal stresses in itself. It is preferable that as a stress absorption layer the material thereof has a composition comprising flexibility and moreover has thermoplastic or thermosetting properties, such as a polyimide.

The intervening layer 84 is provided to avoid the vicinity of the protrusions 82 of the wiring pattern 78. Therefore, the intervening layer 84 is prevented from covering up the protrusions 82. This ensures that bonding defects can be prevented by the intervention of the intervening layer 84 between the protrusions 82 and the electrodes 72.

The flexible substrate 74 is then placed above the active surface 70a of the semiconductor chip 70, as shown in FIG. 9A. More specifically, the flexible substrate 74 is disposed, positioning the protrusions 82 of the wiring pattern 78 on the electrodes 72. Next, the flexible substrate 74 is mounted onto the semiconductor chip 70, as shown in FIG. 9B. Pressure and heat are then applied to the intervening layer 84 from above the flexible substrate 74 by a jig 86. The application of pressure enables the intervening layer 84 to adhere to the active surface 70a of the semiconductor chip 70. If the intervening layer 84 has thermoplastic properties, the application of heat improves the adhesion.

In this case, the jig 86 could be a tool having a contact surface that is formed to be flat, as already known in the art, or it could have a contact surface to the flexible substrate 74 that is curved, as shown in FIG. 9B. Therefore, when this jib 86 is pressed down in such a manner that it rotates, the position at which pressure is applied is gradually shifted, to perform a sequence of local pressure applications. This ensures that any voids between the intervening layer 84 and the active surface 70a are pushed outward. Removal of such voids makes it possible to remove air bubbles and also prevents the accumulation of moisture.

Next, a bonding tool 88 is used to bond the protrusions 82 and the electrodes 72, as shown in FIG. 9C. The configuration of this bonding tool 88 is such that the connection portions alone can be pressed into a connected state in a batch, but other portions thereof are not touched. In this example, the cross-sectional shape of the bonding tool 88 is indented, with protruding portions of the tool 88 provided along two sides thereof. Note that the protruding portions of this tool could be provided in accordance with the bonding positions, such as along all four sides thereof, but it is not limited thereto.

This embodiment facilitates the bonding work by first positioning the protrusions 82 and the electrodes 72, then attaching the intervening layer 84 to the semiconductor chip 70. If facilitation of the bonding work is not taken into consideration, however, the sequence could be such that the protrusions 82 and the electrodes 72 are positioned, the bonding is performed, and then the intervening layer 84 is attached to the semiconductor chip 70.

In accordance with the thus made semiconductor device, since the intervening layer 84 fulfills the function of a stress absorption layer, it is not necessary to inject a molding material as a stress relief layer. Note, however, that molding material could be injected deliberately in the vicinity of the protrusions 82 of the wiring pattern 78, with the objective of protecting the connection portions. The omission of this expensive molding material makes it possible to reduce costs. In addition, since no molding material is injected, the possibility of voids being created on the active surface 70*a* is reduced, increasing the yield.

(Tenth Embodiment)

Figure 10:
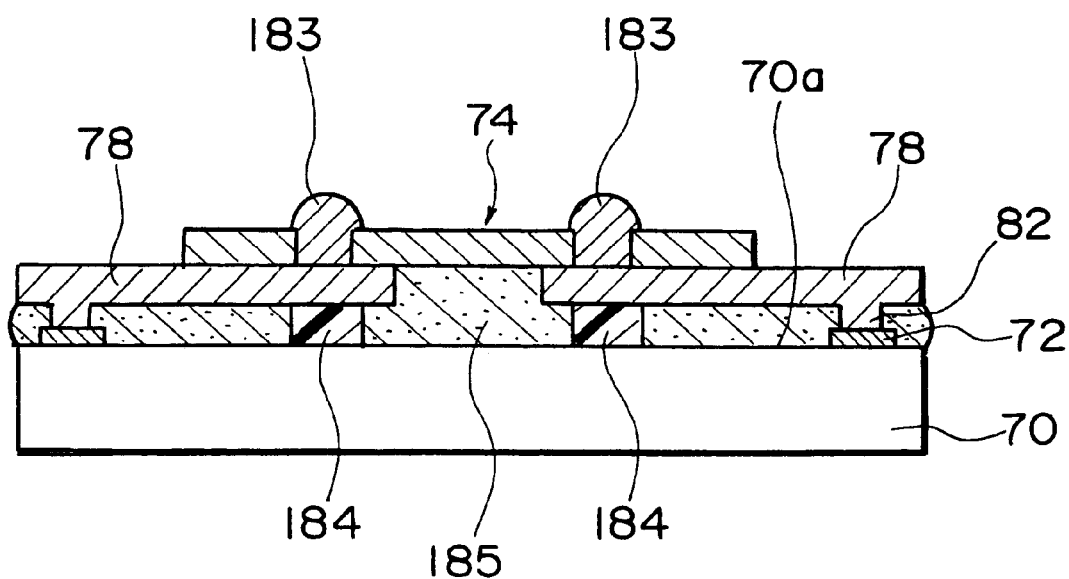
FIG. 10 is a cross-sectional view of a semiconductor device in accordance with a tenth embodiment.

FIG. 10 is a view showing a semiconductor device in accordance with a tenth embodiment. The semiconductor device shown in this figure is a variant of the semiconductor device shown in FIG. 9C, so the same components are given the same reference numbers and further description thereof is omitted.

In other words, intervening layers 184 that are provided on the flexible substrate 74 are only provided directly below external electrodes 183. The intervening layers 184 is formed of an adhesive, in the same manner as the intervening layer 84 of FIG. 9C. Therefore, the intervening layers 184 form gaps between the flexible substrate 74 and the active surface 70*a,* connecting the two. Note, however, that since the intervening layers 184 are smaller than that of FIG. 9C, the adhesion thereof is lessened.

In this case, resin 185 is injected between the flexible substrate 74 and the active surface 70*a*. The resin 185 connects the flexible substrate 74 and the active surface 70*a* and protects the active surface 70*a* from moisture. Therefore, the resin 185 need not be provided with properties necessary for stress absorption.

In accordance with this embodiment, the intervening layers 184 connect the flexible substrate 74 and the active surface 70*a,* if only slightly, so that gaps are formed between the two components and the flexible substrate 74 can be attached to the semiconductor chip 70 thereby. The flexible substrate 74 and the active surface 70*a* are also connected by the resin 185 and also the active surface 70*a* is protected from moisture thereby. Even although the regions on which the intervening layers 184 are provided are small, they can provide sufficient stress absorption.

Figure 11:
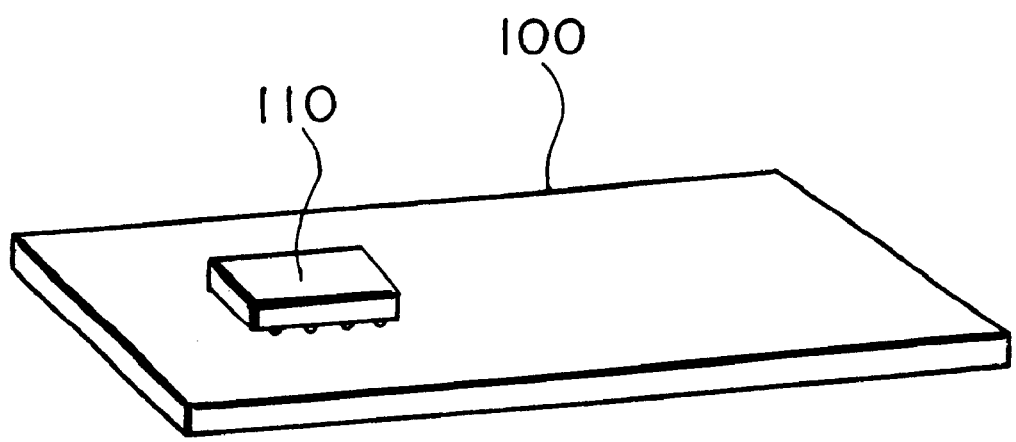
FIG. 11 shows a circuit board on which a semiconductor device made in accordance with any one of the first to tenth embodiments is mounted.

FIG. 11 shows a circuit board 100, on which a semiconductor device 110 made by applying one of the above described first to tenth embodiments, is mounted.

This invention is not to be taken as limited to the above described embodiments, but various modifications thereto are possible. In particular, it is preferable that the flexible substrate is formed by using a film carrier tape. It is also preferable that a plurality of semiconductor devices are made integrally on this film carrier tape, to improve handling. In such a case, the process of mounting and assembling the semiconductor device can be performed on an ordinary ILB (Inner Lead Bonding) line that corresponds to TAB (Tape Automated Bonding) technique.

Note that if a film carrier tape is used, it may happen that the fabrication process can not prevent the flexible substrate, particularly the base portion thereof, from being larger than the active surface of the semiconductor chip; because each flexible substrate, which is integrated with one another into a film carrier tape and will be eventually cut apart from one another, requires suspension portions in the meantime; and because usually, these suspension portions will eventually be cut away, but the accuracy of the cutting device may cause difficulties, cutting the boundary surfaces of the semiconductor chips. Note that, in such a case, the flexible substrate could be formed wider than the width of the semiconductor chip in two facing directions out of four directions and narrower than the width of the semiconductor chip in the other two directions, with the suspension portions provided on its wider sides, even if it is not formed larger in all directions of the semiconductor chip.

The above embodiments were described with reference to the so-called fan-in type of semiconductor device, but this invention is not limited thereto and it can also be applied to a fan-in/out type of semiconductor device wherein external electrodes are also provided along the outer periphery of the semiconductor chip.

In addition, since FIGS. 1 to 9C are cross-sectional views, they show leads disposed in two directions, but in practice the wiring pattern could be disposed in a plurality of directions.

In the above described embodiments, bumps were formed on a flexible substrate, but other well-known bump formation techniques could be used to provide bumps on the semiconductor chip side, such as providing gold bumps on the chip side.

What is claimed is:

1. A method of making a semiconductor device comprising the steps of:

preparing a flexible substrate that has a region overlapping a semiconductor chip, said flexible substrate having external terminal formation portions, said external terminal formation portions are formed within said overlapped region, said flexible substrate having a wiring pattern formed thereon;

providing an intervening layer on at least one of a surface of said semiconductor chip on which electrodes are formed and a surface of said flexible substrate having a wiring pattern formed thereon;

providing an intervening layer on at least one of a surface of said semiconductor chip on which electrodes are formed and a surface of said flexible substrate that is disposed facing said surface of said semiconductor chip, said intervening layer provided to avoid a bonding portion between said flexible substrate and said semiconductor chip;

positioning said flexible substrate and said semiconductor chip to sandwich said intervening layer therebetween and opposing said electrodes of said semiconductor chip to said wiring pattern on said flexible substrate;

applying pressure to said intervening layer from at least one of said flexible substrate and said semiconductor chip using a pressure tool so that said intervening layer adheres to both of said flexible substrate and said semiconductor chip, bonding said electrodes of said semiconductor chip to said wiring pattern on said flexible substrate without bending said wiring pattern; and forming external terminals at said external terminal formation portions to be exposed on a side opposite to said intervening layer and to contact said wiring pattern.

2. The method of making a semiconductor device as defined in claim 1, wherein said intervening layer formed during said step of providing said intervening layer is provided within a region that excludes a region corresponding to said external terminal formation portions.

3. The method of making a semiconductor device as defined in claim 1, wherein a stress absorption layer is provided as part of said intervening layer between said semiconductor chip and said flexible substrate.

4. The method of making a semiconductor device as defined in claim 3, wherein said stress absorption layer is provided in at least a region corresponding to said external terminal formation portions.

5. The method of making a semiconductor device as defined in claim 1, wherein said intervening layer is provided by printing a resin thereon.

6. The method of making a semiconductor device as defined in claim 1, wherein said intervening layer is provided by ejecting a resin in an ink-jet method.

7. The method of making a semiconductor device as defined in claim 6, wherein said intervening layer is provided on an area in said surface of said semiconductor chip on which said electrodes are formed.

8. The method of making a semiconductor device as defined in claim 3, wherein said stress absorption layer is formed by injecting a molding material.

9. The method of making a semiconductor device as defined in claim 5, wherein said resin has a thermosetting or ultraviolet-setting property.

10. The method of making a semiconductor device as defined in claim 1, wherein said intervening layer has a property of absorbing stress between said semiconductor chip and said flexible substrate, and said intervening layer adhering to said semiconductor chip and said facing surface of said flexible substrate to form a stress absorption layer.

11. The method of making a semiconductor device as defined in claim 10, wherein said intervening layer has thermoplastic property, and said step of forming a stress absorption layer comprises a step of applying heat and pressure to said intervening layer.

12. The method of making a semiconductor device as defined in claim 11, wherein during said step of applying pressure, a position at which pressure is applied to said intervening layer is gradually shifted, to perform a sequence of local pressure applications.

13. The method of making a semiconductor device as defined in claim 1, wherein said intervening layer is provided on an area in said surface of said flexible substrate disposed facing said surface of said semiconductor chip on which said electrodes are formed.

14. The method of making a semiconductor device as defined in claim 13, wherein said step of providing said intervening layer is included in a step of forming said wiring pattern and a plurality of protrusions are formed on said wiring pattern by etching said wiring pattern at locations to be bonded to said electrodes of said semiconductor chip during said step of forming said wiring pattern.

15. The method of making a semiconductor device as defined in claim 14, wherein through holes are formed in said flexible substrate at positions corresponding to said protrusions, and said external terminals are provided through said through holes on a surface of said flexible substrate opposite to said surface on which said wiring pattern is provided.

16. The method of making a semiconductor device as defined in claim 15, further comprising a step of painting an insulating resin onto at least positions of said protrusions facing said semiconductor chip, said protrusions acting as said intervening layer.

17. A method of making a semiconductor device as defined in claim 1, wherein said intervening layer is provided at a position closer to the central area in said semiconductor chip than said electrodes.

18. The method of making a semiconductor device as defined in claim 1, wherein said intervening layer is pressed so that said intervening layer does not reach said bonding portion between said flexible substrate and said semiconductor chip.

19. The method of making a semiconductor device as defined in claim 1, wherein said pressure tool has a curved surface to apply pressure.

20. A method of making a semiconductor device comprising the steps of:

preparing a flexible substrate that has a region overlapping a semiconductor chip, said flexible substrate having external terminal formation portions, said external terminal formation portions are formed within said overlapped region;

providing an intervening layer on at least one of a surface of said semiconductor chip on which electrodes are formed and a surface of said flexible substrate that is disposed facing said surface of said semiconductor chip, said intervening layer provided to avoid a bonding portion between said flexible substrate and said semiconductor chip;

positioning said flexible substrate and said semiconductor chip to sandwich said intervening layer therebetween;

applying pressure to said intervening layer from at least one of said flexible substrate and said semiconductor chip using a pressure tool so that said intervening layer adheres to both of said flexible substrate and said semiconductor chip, wherein during said step of applying pressure, a position at which pressure is applied to said intervening layer is gradually shifted, to perform a sequence of local pressure applications; and forming external terminals at said external terminal formation portions.

21. The method of making a semiconductor device as defined in claim 1, wherein a wiring pattern is formed on said flexible substrate, after said step of applying pressure further comprising a step of bonding said wiring pattern and said electrodes of said semiconductor chip.

22. A method of making a semiconductor device comprising the steps of:

preparing a flexible substrate that has a region overlapping a semiconductor chip, said substrate having external terminal formation portions, said external terminal formation portions are formed within said overlapped region, said substrate having a wiring pattern formed thereon;

providing a gap preservation member on at least one of a surface of said semiconductor chip on which electrodes are formed and a surface of said substrate that is disposed facing said surface having electrodes of said semiconductor chip, said gap preservation member provided to avoid a bonding portion between said substrate and said semiconductor chip;

arranging said semiconductor chip and said substrate with surfaces thereof facing one another, in the state in which said gap preservation member is interposed therebetween and in which said electrodes of said semiconductor chip face said wiring pattern on said flexible substrate; and applying pressure to said gap preservation member from at least one of said substrate and said conductor chip to said using a pressure tool, bonding said electrodes of said semiconductor chip said wiring pattern on said flexible substrate without bending said wiring pattern; and forming external terminals at said external formation portions; and forming external terminals formed at said external formation portions to be exposed on a said opposite to said intervening layer and to contact said wiring pattern, wherein said gap preservation member is formed by ejecting a resin by a ink-jet method on a rigid object and in said step of applying pressure said gap preservation member adheres to both of said substrate and said semiconductor chip.

23. The method of making a semiconductor device as defined in claim 22, wherein said rigid object is said semiconductor chip.

24. The method of making a semiconductor device as defined in claim 22, said gap preservation member is formed with an ink-jet marking device.

25. The method of making a semiconductor device as defined in claim 22, wherein said gap preservation member is provided at a position closer to the central area in said semiconductor chip than said electrodes.

26. A semiconductor device comprising:
- a semiconductor chip having electrodes;
- a flexible substrate having external terminal formation portions, said flexible substrate having a wiring pattern formed thereon, said wiring pattern on said flexible substrate opposed and bonded to said electrodes of said semiconductor chip without bending said wiring pattern;
- an intervening layer interposed between said semiconductor chip and said flexible substrate, said intervening layer including a gap preservation member and a resin, said gap preservation member provided to completely avoid said external terminal formation portions on said flexible substrate; and
- external terminals formed at said external terminal formation portions, said external terminals exposed on a side opposite to said intervening layer in contact with said wiring pattern.

27. The semiconductor device as defined in claim 26, wherein said gap preservation member is provided on an active surface of said semiconductor chip, said gap preservation member provided at a position to avoid only an area overlapping said external terminal formation portions.

28. A semiconductor device comprising:
- a semiconductor chip having electrodes;
- a flexible substrate having external terminal formation portions formed thereon, said flexible substrate having a wiring pattern formed thereon without bending in a direction of said semiconductor chip;
- an intervening layer interposed between said semiconductor chip and said flexible substrate, and
- an external terminal provided at each of said external terminal formation portions, said external terminal exposed on a side opposite to said intervening layer in contact with said wiring patterns,
- wherein said external terminal is made from a first material and a second material, and a melting temperature of said first material is greater than that of said second material.

29. The semiconductor device as defined in claim 28, wherein said external terminal has a ball portion made from said first material and a surface portion covering said ball portion, said surface portion formed from said second material.

30. A semiconductor device comprising:
- a flexible substrate, said flexible substrate having a wiring pattern formed thereon, said wiring pattern having protrusions, said flexible substrate having external terminal formation portions formed thereon;
- a semiconductor chip mounted on said flexible substrate with a face down structure, said semiconductor chip having electrodes, said electrodes bonded to said protrusions of said wiring pattern without bending said wiring pattern;
- a gap preservation member interposed between said semiconductor chip and said flexible substrate; and
- external terminals provided at said external terminal formation portions, said external terminals exposed on a side opposite to said gap preservation member in contact with said wiring pattern,
- wherein the height of said gap preservation member is substantially the same as or less than the total height of each of said electrodes provided on said semiconductor chip connected to each of said protrusions of said wiring pattern.

* * * * *